(12) United States Patent
Kanematsu

(10) Patent No.: US 10,766,054 B2
(45) Date of Patent: Sep. 8, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventor: Yasunori Kanematsu, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 217 days.

(21) Appl. No.: 15/710,868

(22) Filed: Sep. 21, 2017

(65) Prior Publication Data

US 2018/0085780 A1    Mar. 29, 2018

(30) Foreign Application Priority Data

Sep. 27, 2016 (JP) ................................. 2016-188638
Aug. 8, 2017 (JP) ................................. 2017-153163

(51) Int. Cl.
| | |
|---|---|
| B05D 3/12 | (2006.01) |
| B05D 1/00 | (2006.01) |
| B05D 3/00 | (2006.01) |
| H01L 21/06 | (2006.01) |
| H01L 21/02 | (2006.01) |
| H01L 21/67 | (2006.01) |

(52) U.S. Cl.
CPC ............ B05D 1/002 (2013.01); B05D 3/002 (2013.01); H01L 21/02057 (2013.01); H01L 21/06 (2013.01); H01L 21/6715 (2013.01)

(58) Field of Classification Search
CPC ... B05D 1/005; B05D 3/002; H01L 21/02057; H01L 21/6715; H01L 21/06
USPC .......................................................... 427/240
See application file for complete search history.

(56) References Cited

U.S. PATENT DOCUMENTS

| | | | |
|---|---|---|---|
| 2005/0051930 A1* | 3/2005 | Kawakami | .......... B81C 1/00841 264/341 |
| 2005/0224923 A1* | 10/2005 | Daley | ...................... G03F 7/40 257/642 |

(Continued)

FOREIGN PATENT DOCUMENTS

| | | |
|---|---|---|
| JP | H11-087226 A | 3/1999 |
| JP | 2007-019161 A | 1/2007 |

(Continued)

OTHER PUBLICATIONS

Office Action dated Dec. 11, 2018 in corresponding Korean Patent Application No. 10-2017-0115926.

*Primary Examiner* — Kirsten Jolley
(74) *Attorney, Agent, or Firm* — Ostrolenk Faber LLP

(57) ABSTRACT

A substrate processing method comprises: a liquid film forming step of forming a liquid film of a rinsing liquid on a pattern forming surface of a substrate formed with a pattern; a liquid pool forming step of forming a liquid pool of an organic solvent by supplying the organic solvent to the liquid film near a center of rotation of the substrate; a replacement step of replacing the rinsing liquid constituting the liquid film with the organic solvent by supplying the organic solvent to the liquid pool while rotating the substrate at a rotational speed higher than in the liquid pool forming step; an application step of applying a filler solution to the pattern forming surface coated with the organic solvent; and a filling step of causing a filler contained in the filler solution and applied to the pattern forming surface to sink and filling concave portions of the pattern with the filler.

7 Claims, 12 Drawing Sheets

(56) References Cited

U.S. PATENT DOCUMENTS

| | | | |
|---|---|---|---|
| 2007/0009839 A1 | 1/2007 | Harumoto | 430/313 |
| 2009/0032067 A1 | 2/2009 | Kojimaru et al. | 134/26 |
| 2013/0008868 A1 | 1/2013 | Uozumi et al. | 216/41 |
| 2016/0071747 A1 | 3/2016 | Uozumi et al. | |
| 2016/0247698 A1 | 8/2016 | Yoshizumi et al. | |
| 2016/0336169 A1* | 11/2016 | Fujiwara | B08B 3/08 |
| 2018/0133748 A1* | 5/2018 | Fujiwara | B05D 1/002 |

FOREIGN PATENT DOCUMENTS

| | | |
|---|---|---|
| JP | 2011-124313 A | 6/2011 |
| JP | 2012-015450 A | 1/2012 |
| JP | 2012-243869 A | 12/2012 |
| JP | 2013-016699 A | 1/2013 |
| JP | 2013-042093 A | 2/2013 |
| JP | 2013-042094 A | 2/2013 |
| JP | 2013-258272 A | 12/2013 |
| KR | 10-2009-0013013 A | 2/2009 |
| WO | WO 2012/006139 A2 | 1/2012 |

* cited by examiner

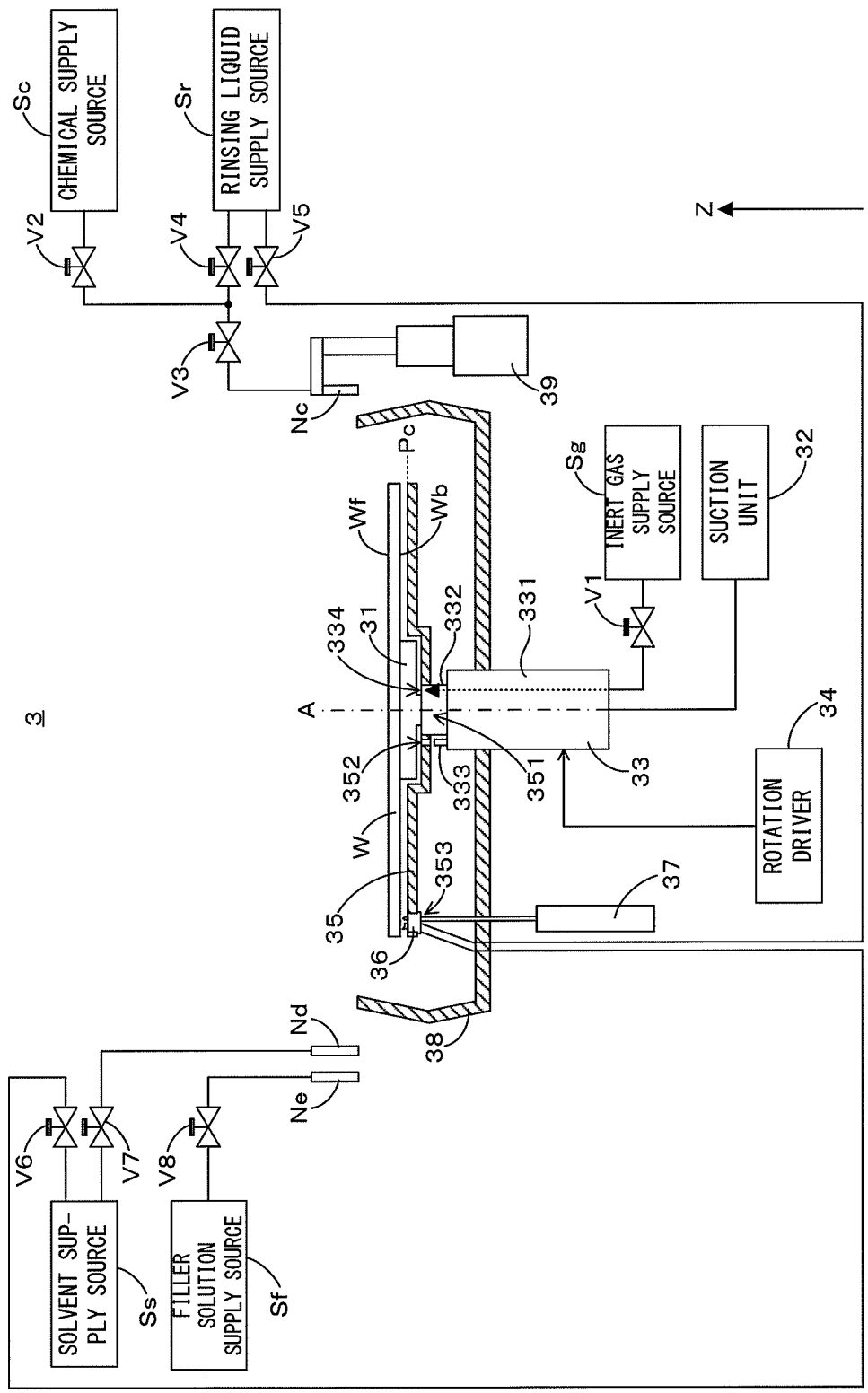
F I G. 2

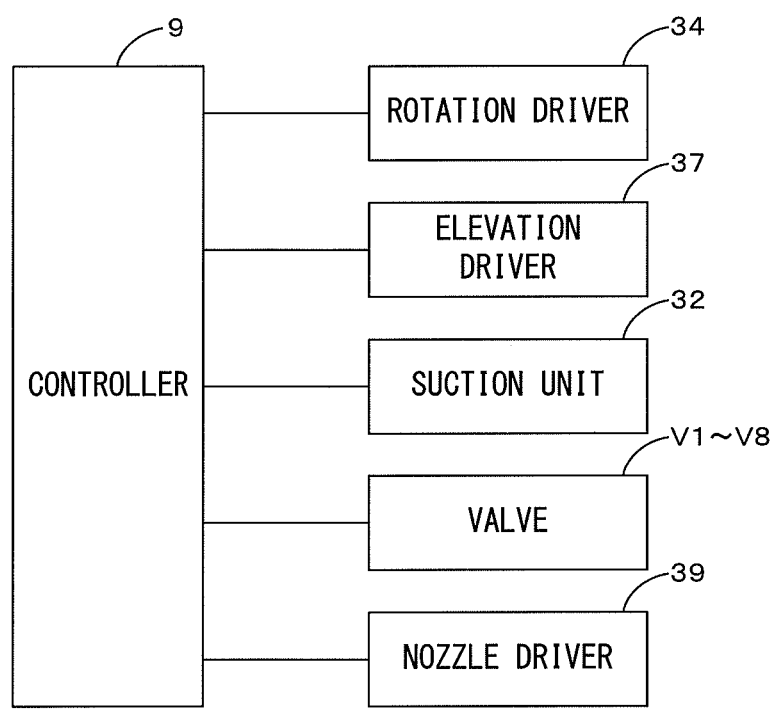
F I G. 4

SUBSTRATE PROCESSING METHOD AND SUBSTRATE PROCESSING APPARATUS

CROSS REFERENCE TO RELATED APPLICATION

This application claims benefit of priority to Japanese Patent Applications enumerated below, the entire content of which is incorporated herein by reference:
No. 2016-188638 filed Sep. 27, 2016; and
No. 2017-153163 filed Aug. 8, 2017.

BACKGROUND OF THE INVENTION

1. Field of the Invention

This invention relates to a substrate processing technique for processing a substrate formed with a pattern on a surface. Note that substrates include various substrates such as glass substrates for liquid crystal display, semiconductor substrates, glass substrates for PDP, glass substrates for photo mask, substrates for color filter, substrates for recoding disc, substrates for solar cell, substrates for precision electronic device including substrates for electronic paper, rectangular glass substrates, flexible substrates for film liquid crystal or substrates for organic EL.

2. Description of the Related Art

A manufacturing process of an electronic component such as a semiconductor device or a liquid crystal display device includes a step of forming a fine pattern by repeatedly applying processes such as film formation on a surface of a substrate and etching. Here, the surface of the substrate needs to be kept in a clean state to satisfactorily perform fine processings on the substrate surface and a cleaning process is performed on the surface of the substrate depending on the situation. Then, the substrate needs to be dried by removing a rinsing liquid such as deionized water (hereinafter, written as "DIW") adhering to the substrate surface after the cleaning process is finished.

One important problem in this drying process is to dry the substrate without collapsing the pattern formed on the substrate surface. A sublimation drying technique is being focused as a method for solving this problem. For example, in JP2007-19161A, a photoresist film coated on a surface of a substrate is dissolved to form a pattern by supplying a developer to a photoresist film subjected to an exposure process. The developer is removed by supplying a rinsing liquid to the surface of this substrate. In the final stage of this rinsing process, a soluble polymer is supplied to the substrate with the substrate surface coated with the rinsing liquid and, thereafter, the soluble polymer is dried. In this way, concave portions (clearances between convex parts formed of the photoresist film) are filled by the polymer. Thereafter, the polymer is removed by selective plasma ashing.

SUMMARY OF THE INVENTION

In such a substrate processing technique, the polymer filled into the concave portions of the pattern needs to be dried. Further, the polymer needs to be removed by plasma ashing. Thus, if bubbles are entrained when the polymer is filled into the concave portions, the bubbles may remain in the concave portions. In this case, during the above drying process and polymer removing process, the bubbles burst to leave bubble marks or part of the polymer become particles. As just described, it is very important in enhancing substrate processing quality to prevent the entrainment of the bubbles into the concave portions.

This invention was developed in view of the above problem and aims to provide a substrate processing technique capable of satisfactorily filling filler into concave portions of a pattern formed on a surface of a substrate while preventing the entrainment of bubbles into the concave portions.

According to a first aspect of the disclosure, there is provided a substrate processing method. The method comprises: a liquid film forming step of forming a liquid film of a rinsing liquid on a pattern forming surface of a substrate formed with a pattern; a liquid pool forming step of forming a liquid pool of an organic solvent by supplying the organic solvent to the liquid film near a center of rotation of the substrate; a replacement step of replacing the rinsing liquid constituting the liquid film with the organic solvent by supplying the organic solvent to the liquid pool while rotating the substrate at a rotational speed higher than in the liquid pool forming step; an application step of applying a filler solution to the pattern forming surface coated with the organic solvent; and a filling step of causing a filler contained in the filler solution and applied to the pattern forming surface to sink and filling concave portions of the pattern with the filler.

According to a second aspect of the disclosure, there is provided a substrate processing apparatus. The apparatus comprises: a holder the holds a substrate substantially in a horizontal posture with a pattern forming surface of the substrate formed with a pattern faced up; a rotator that rotates the substrate held by the holder in a substantially horizontal plane; a rinsing liquid supply unit that supplies a rinsing liquid to the pattern forming surface; an organic solvent supply unit that supplies an organic solvent to the pattern forming surface; a filler solution supply unit that supplies a filler solution to the pattern forming surface; and a control unit that controls the supply of the rinsing liquid by the rinsing liquid supply unit, the supply of the organic solvent by the organic solvent supply unit and the supply of the filler solution by the filler solution supply unit while controlling the rotation of the substrate by the rotator, wherein the control unit: forms a liquid film on the pattern forming surface by the supply of the rinsing liquid; forms a liquid pool of the organic solvent by supplying the organic solvent to the liquid film near a center of rotation of the substrate; replaces the rinsing liquid constituting the liquid film with the organic solvent by increasing the rotational speed of the substrate and supplying the organic solvent to the liquid pool; and fills a filler contained in the filler solution in concave portions of the pattern by applying the filler solution to the pattern forming surface coated with the organic solvent.

In the invention configured as described above, the liquid film of the rinsing liquid on the substrate is replaced with the organic solvent and the filler solution is applied to the pattern forming surface of the substrate coated with the liquid film of the organic solvent to fill the filler in the concave portions of the pattern. Thus, if bubbles are included in the liquid film of the organic solvent, the bubbles are entrained in the concave portions when the filler contained in the filler solution is filled into the concave portions of the pattern. Particularly, if the supply of the organic solvent does not keep up with the removal of the rinsing liquid when the rinsing liquid is replaced with the organic solvent by supplying the organic solvent to the liquid film while rotating the substrate, so-called liquid separation may occur near the center of rotation of the substrate and a gas phase may enter an interface between the rinsing liquid and the organic solvent. In contrast, in the invention, the liquid pool of the organic solvent is formed by supplying the organic solvent to the liquid film of the rinsing liquid near the center of rotation of the substrate prior to the replacement process. That is, the organic solvent is already present near the center of rotation of the substrate when the replacement process is started. Thus, the occurrence of liquid separation is effectively prevented. As a result, it is possible to fill the filler into the concave portions while preventing the entrainment of bubbles into the concave portions of the pattern formed on the substrate.

The above and further objects and novel features of the disclosure will more fully appear from the following detailed description when the same is read in connection with the accompanying drawings. It is to be expressly understood, however, that the drawings are for the purpose of illustration only and are not intended as a definition of the limits of the disclosure.

BRIEF DESCRIPTION OF THE DRAWINGS

FIGS. 2 and 3 are partial sectional views schematically showing an example of the cleaning process unit equipped in the substrate processing system of FIG. 1.

FIG. 4 is a block diagram showing a part of an electrical configuration of the substrate processing system.

DETAILED DESCRIPTION OF THE PREFERRED EMBODIMENTS

Figure 1:
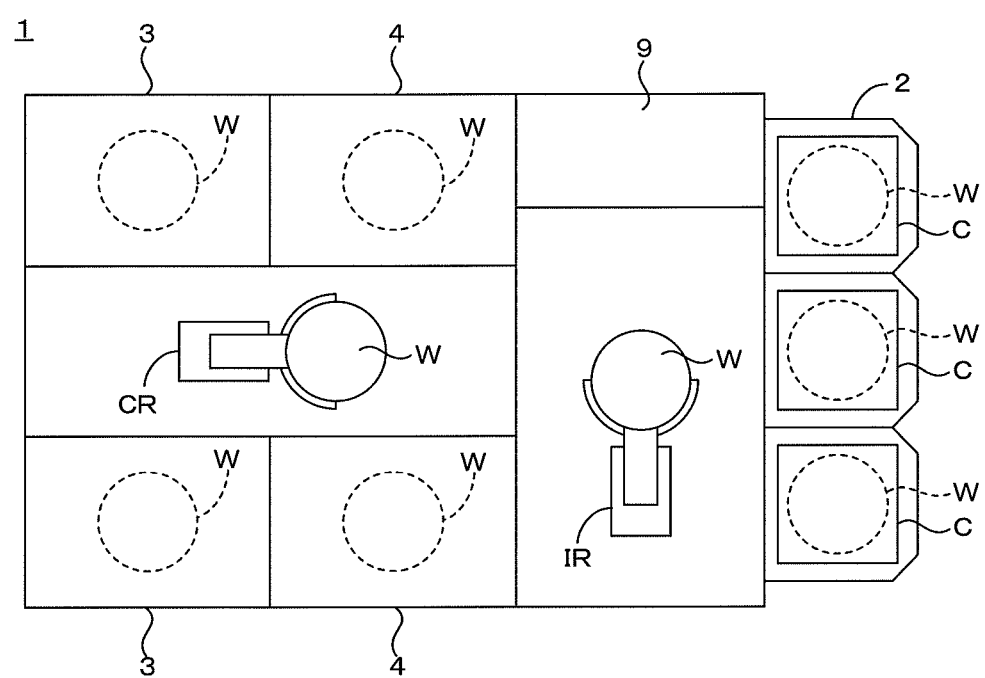
FIG. 1 is a plan view schematically showing a substrate processing system equipped with a cleaning process unit as one embodiment of a substrate processing apparatus according to the invention.

FIG. 1 is a plan view schematically showing a substrate processing system equipped with a cleaning process unit as one embodiment of a substrate processing apparatus according to the invention. The substrate processing system 1 of FIG. 1 is a single-wafer type substrate processing system for performing various substrate processes such as a cleaning process and a heating process to substrates W one by one. Examples of the substrate W to be processed include glass substrates for liquid crystal display, semiconductor substrates, glass substrates for PDP, glass substrates for photo mask, substrates for color filter, substrates for recoding disc, substrates for solar cell, substrates for precision electronic device including substrates for electronic paper, rectangular glass substrates, flexible substrates for film liquid crystal and substrates for organic EL. In an example described below, the substrate W has a circular shape having a predetermined diameter of 100 mm to 400 mm and has an uneven front surface Wf (FIG. 2) formed with fine pattern elements Wp (FIG. 8) and a flat back surface Wb (surface on a side opposite to the front surface Wf). However, the configuration of the substrate including the shape and dimensions is not limited to this example.

The substrate processing system 1 includes a plurality of load ports 2 for accommodating the substrates W, a plurality of cleaning process units 3 for performing the cleaning process on the substrate W and a plurality of heating process units 4 for performing the heating process on the substrate W. Further, to transfer the substrates W in the system, the substrate processing system 1 includes an indexer robot IR and a center robot CR. Out of these, the indexer robot IR transfers the substrates W on paths between the load ports 2 and the center robot CR and the center robot CR transfers the substrates W on paths between the indexer robot IR and the respective process units 3, 4. Further, the substrate processing system 1 includes a controller 9 configured by a computer, and the controller 9 controls each unit of the apparatus in accordance with a predetermined program, whereby each substrate process described below is performed on the substrate W.

The load port 2 holds a carrier C for accommodating a plurality of substrates W stacked in a vertical direction. In this load port 2, each substrate W is accommodated with the front surface Wf thereof faced up (i.e. the back surface Wb thereof faced down). When the indexer robot IR takes out an unprocessed substrate W from the carrier C of the load port 2, the indexer robot IR transfers this substrate W to the center robot CR and the center robot CR loads the substrate W received from the indexer robot IR into the cleaning process unit 3.

The cleaning process unit 3 coats the front surface Wf of the substrate W including clearances between the pattern elements Wp with a liquid film of a filler solution (coating process) after the loaded substrate W is cleaned (cleaning process). Here, the filler solution is a solution containing a filler as a solute. As just described, the cleaning process unit 3 is a substrate processing apparatus for performing not only the cleaning process, but also other substrate processes such as the coating process. Note that the configuration and operation of the cleaning process unit 3 are described in detail later.

When each substrate process in the cleaning process unit 3 is completed, the center robot CR unloads the substrate W from the cleaning process unit 3 and loads this substrate W into the heating process unit 4. The heating process unit 4 includes a hot plate (not shown) and heats the substrate W loaded by the center robot CR by the hot plate (heating process). By this heating process, a solvent evaporates from the liquid film of the filler solution coating the front surface Wf of the substrate W and the solute of the filler solution, i.e. the filler, is solidified between adjacent pattern elements Wp, i.e. in concave portions Wc (FIG. 8) of the pattern. Note that a method for heating the substrate W is not limited to this. For example, the substrate W may be heated by irradiating infrared rays to the substrate W or blowing hot air to the substrate W.

When the heating process in the heating process unit 4 is completed, the center robot CR transfers the substrate W unloaded from the heating process unit 4 to the indexer robot IR and the indexer robot IR accommodates the received substrate W into the carrier C of the load port 2. The substrate W finished with each substrate process in the substrate processing system 1 in this way is transferred to an external filler removing apparatus. This filler removing apparatus removes the filler from the front surface Wf of the substrate W including the clearances between the pattern elements Wp by dry etching. Note that a method for removing the filler is not limited to this. For example, the filler may be removed by the sublimation of the filler as in JP2013-258272A or by a plasma process as in JP2011-124313A.

Figure 3:
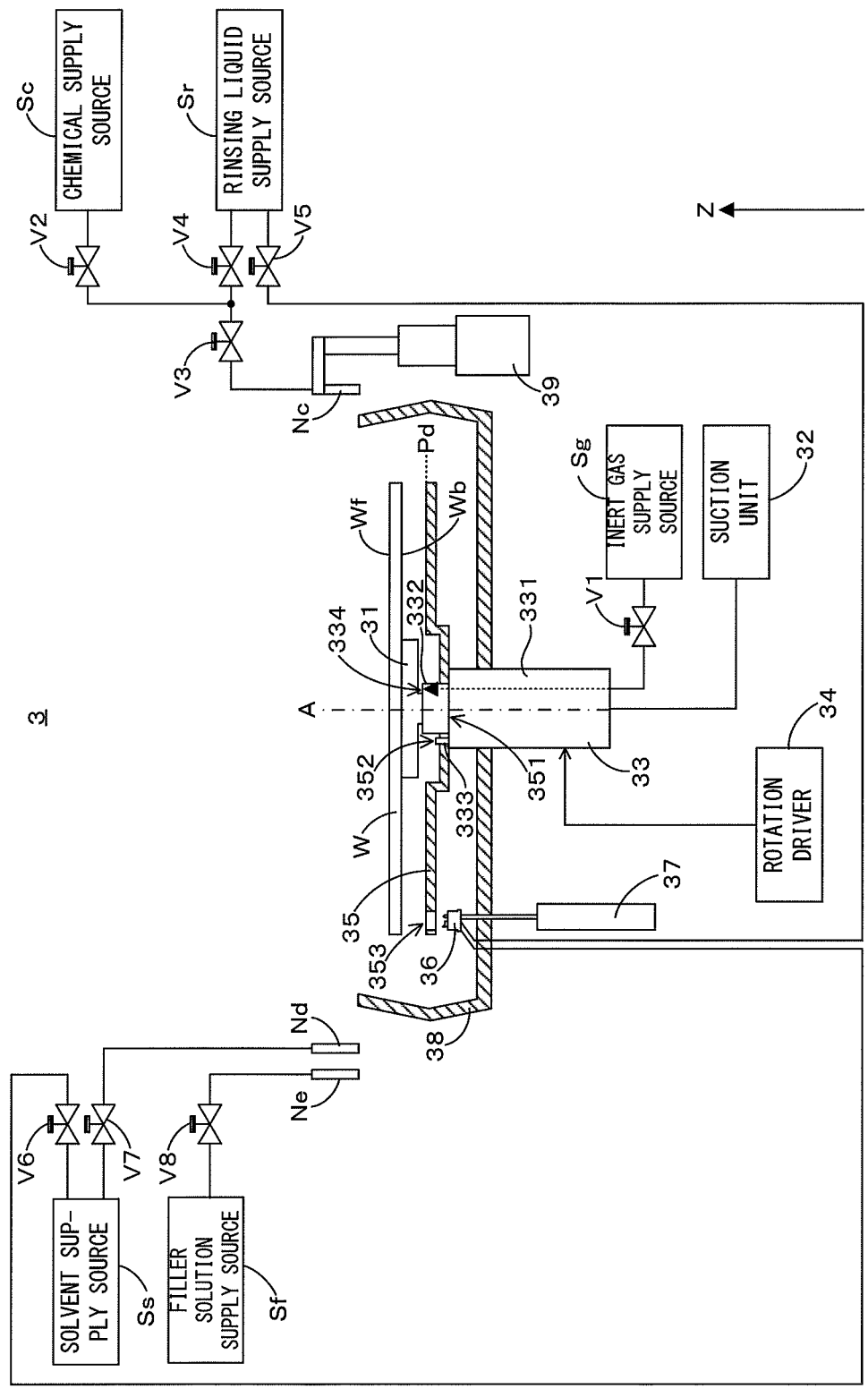

FIGS. 2 and 3 are partial sectional views schematically showing an example of the cleaning process unit equipped in the substrate processing system of FIG. 1. FIG. 4 is a block diagram showing a part of an electrical configuration of the substrate processing system. FIGS. 2 and 3 differ in the heights of a cover plate 35 and a nozzle unit 36 to be described later. Further, a vertical direction Z is shown as appropriate in FIGS. 2, 3 and subsequent figures.

The cleaning process unit 3 includes a spin chuck 31 for holding the substrate W loaded by the center robot CR and a suction unit 32 for supplying a negative pressure to the spin chuck 31. This spin chuck 31 is shaped such that a cylindrical shaft projects downward from a central portion of the lower surface of a disc, and substantially rotationally symmetrical with respect to a center line A parallel to the vertical direction Z. A plurality of suction holes are open in the upper surface of the spin chuck 31 and the substrate W is horizontally placed on the upper surface of the spin chuck 31. In this way, the spin chuck 31 contacts a central portion of the back surface Wb of the substrate W from below with the front surface Wf of the substrate W faced up. In this state, when the controller 9 outputs a suction command to the suction unit 32, the suction unit 32 supplies the negative pressure to the suction holes of the spin chuck 31 and the substrate W is sucked and held by the spin chuck 31.

Further, the cleaning process unit 3 includes a rotary shaft 33 for holding the spin chuck 31 and a rotation driver 34 configured, for example, by a motor to rotate the rotary shaft 33. The rotary shaft 33 is shaped such that a cylindrical section 332 having a smaller diameter than a cylindrical section 331 projects upward from a central portion of the upper surface of the cylindrical section 331, and the cylindrical sections 331, 332 are substantially rotationally symmetrical with respect to the center line A. Further, the rotary shaft 33 includes an engaging projection 333 projecting upward on the upper surface of the cylindrical section 331 and lateral to the cylindrical section 332. When the controller 9 outputs a rotation command to the rotation driver 34, the rotation driver 34 gives a rotational drive force (torque) to the rotary shaft 33 and the rotary shaft 33 rotates about the center line A integrally with the spin chuck 31. As a result, the substrate W held by the spin chuck 31 also rotates about the center line A.

Furthermore, the cleaning process unit 3 includes the cover plate 35 located below the substrate W held by the spin chuck 31. In a plan view, the cover plate 35 has a substantially circular outer shape centered on the center line A, a circular center hole 351 is open in a central portion of the cover plate 35, an engaging hole 352 is open laterally to the center hole 352 of the cover plate 35 and a peripheral edge hole 353 is open in a peripheral edge portion of the cover plate 35. The cylindrical section 332 of the rotary shaft 33 is inserted into the center hole 351 of the cover plate 35 and the cover plate 35 faces the back surface Wb of the substrate W from below on a side outward of the cylindrical section 332 of the rotary shaft 33.

This cover plate 35 is movable upward and downward in the vertical direction Z and can be selectively positioned at a proximate positions Pc (FIG. 2) proximate to the back surface Wb of the substrate W and a separated position Pd (FIG. 3) separated more downwardly from the back surface Wb of the substrate W than the proximate position Pc. In a separated state where the cover plate 35 is located at the separated position Pd, the engaging projection 333 of the rotary shaft 33 is engaged with the engaging hole 352 of the cover plate 35. The cover plate 35 is engaged with the rotary shaft 33 in this way, thereby being able to rotate according to the rotation of the rotary shaft 33. On the other hand, in a proximate state where the cover plate 35 is located at the proximate position Pc, the cover plate 35 is proximate to the back surface Wb of the substrate W, for example, with a clearance of about 1 mm to 10 mm defined therebetween, and covers at least the peripheral edge portion of the back surface Wb of the substrate W from below. Further, in this proximate state, the engaging hole 352 of the cover plate 35 is disengaged from the engaging projection 333 of the rotary shaft 33 and the cover plate 35 is stationary regardless of the rotation of the rotary shaft 33.

Figure 5:
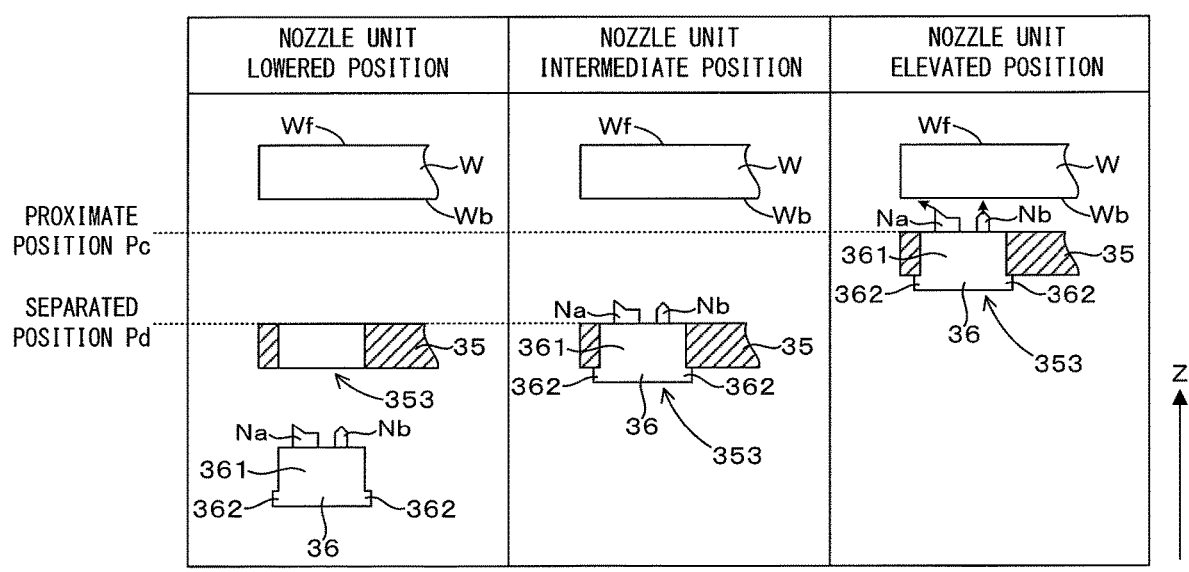
FIG. 5 is partial sectional views schematically showing an example of elevating and lowering movements of the nozzle unit and the cover plate.

Further, the cleaning process unit 3 includes the nozzle unit 36 removably engageable with the engaging hole 353 of the cover plate 35 from below and an elevation driver 37 for elevating and lowering the nozzle unit 36. The elevation driver 37 elevates and lowers the cover plate 35 as the nozzle unit 36 is elevated and lowered. FIG. 5 is partial sectional views schematically showing an example of elevating and lowering movements of the nozzle unit and the cover plate. Columns "Nozzle Unit Lowered Position", "Nozzle Unit Intermediate Position" and "Nozzle Unit Elevated Position" of FIG. 5 respectively indicate states where the nozzle unit 36 is at a lowered position, at an intermediate position and at an elevated position. Next, the cleaning process unit 3 is described with reference to FIG. 5 in addition to FIGS. 2 to 4.

As shown in FIG. 5, the nozzle unit 36 includes a base section 361 and two lower nozzles Na, Nb attached to the upper surface of the base section 361. The base section 361 includes a laterally projecting projection 362 on a bottom part thereof. The two lower nozzles Na, Nb are arranged in a radial direction of the substrate W held by the spin chuck 31, the lower nozzle Na on a peripheral edge side in the radial direction discharges a processing liquid obliquely upwardly toward an outer side and the lower nozzle Nb on a center side in the radial direction discharges the processing liquid in parallel to the vertical direction Z.

The elevation driver 37 is, for example, configured by an actuator and elevates and lowers the nozzle unit 36 between the lowered position (FIG. 3) and the elevated position (FIG. 2) higher than the lowered position in accordance with a command from the controller 9. As shown in FIG. 3 and the column of "Nozzle Unit Lowered Position" of FIG. 5, in a state where the nozzle unit 36 is located at the lowered position, the nozzle unit 36 located at the lowered position is located below the cover plate 35 located at the separated position Pd. As shown in the column of "Nozzle Unit Intermediate Position" of FIG. 5, when the nozzle unit 36 is elevated from the lowered position and reaches the intermediate position, the nozzle unit 36 is engaged with the peripheral edge hole 353 of the cover plate 35 located at the separated position Pd and the projection 362 of the nozzle unit 36 comes into contact with the lower surface of the cover plate 35. When the nozzle unit 36 is further elevated, the cover plate 35 is elevated together with the nozzle unit 36 and the cover plate 35 and the rotary shaft 33 are disengaged. Then, as shown in FIG. 2 and the column of "Nozzle Unit Elevated Position" of FIG. 5, the cover plate 35 reaches the proximate position Pc as the nozzle unit 36 reaches the elevated position.

In the proximate state where the cover plate 35 is located at the proximate position, the upper surface of the base section 361 and that of the cover plate 35 are arranged flush with each other, and the lower nozzles Na, Nb are proximate to the back surface Wb of the substrate W held by the spin chuck 31. The lower nozzle Na can discharge the processing liquid to the peripheral edge portion of the back surface Wb and the lower nozzle Nb can discharge the processing liquid to the back surface Wb on a side inwardly of the lower nozzle Na.

Further, when the nozzle unit 36 is lowered from the elevated position to the lowered position, each operation is performed in a sequence opposite to the one described above. That is, the cover plate 35 is lowered from the proximate position Pc to the separated position Pd as the nozzle unit 36 is lowered. The cover plate 35 is engaged with the rotary shaft 33 to stop moving downward when reaching the separated position Pd. The nozzle unit 36 is separated downwardly from the peripheral edge hole 353 of the cover plate 35 by being further lowered, and reaches the lowered position.

Referring back to FIGS. 2 to 4, the embodiment is further described. As shown in FIGS. 2 and 3, the cleaning process unit 3 includes a cup 38 for surrounding the substrate W held by the spin chuck 31 and the cover plate 35 from side and below. Thus, the processing liquid scattered or falling down from the substrate W and the cover plate 35 is collected into the cup 38. This cup 38 is elevated and lowered between an elevated position of FIG. 3 and a lowered position below the elevated position by an unillustrated elevation mechanism. The substrate W is attached to and detached from the spin chuck 31 with the cup 38 located at the lowered position, and various substrate processes are performed on the substrate W mounted on the spin chuck 31 with the cup 38 located at the elevated position.

Further, the cleaning process unit 3 includes an inert gas supply source Sg for supplying inert gas such as nitrogen gas. A gas supply port 334 open in an upper part of the cylindrical section 332 of the rotary shaft 33 is connected to the inert gas supply source Sg via a valve V1. Thus, when the controller 9 opens the valve V1, the inert gas is supplied to between the back surface Wb of the substrate W held by the spin chuck 31 and the upper surface of the cover plate 35 from the inert gas supply source Sg. In this way, the inert gas flows in a direction from the center toward the peripheral edge of the substrate W between the back surface Wb of the substrate W and the cover plate 35. On the other hand, when the controller 9 closes the valve V1, the supply of the gas from the inert gas supply source Sg is stopped.

Furthermore, the cleaning process unit 3 includes three upper nozzles Nc, Nd and Ne for discharging the processing liquid to the front surface Wf of the substrate W held by the spin chuck 31. Further, the cleaning process unit 3 includes a nozzle driver 39 for moving the upper nozzle Nc between a facing position facing the center of the front surface Wf of the substrate W held by the spin chuck 31 and a retracted position retracted horizontally from the front surface Wf of this substrate W. Further, although not shown, the cleaning process unit 3 also includes similar nozzle drivers 39 for each of the upper nozzles Nd, Ne. Upon receiving a command from the controller 9, each nozzle driver 39 moves each upper nozzle Nc, Nd, Ne.

As just described, the cleaning process unit 3 is provided with the lower nozzles Na, Nb for discharging the processing liquid to the back surface Wb of the substrate W and the upper nozzles Nc, Nd and Ne for supplying the processing liquid to the front surface Wf of the substrate W. The cleaning process unit 3 includes various supply sources Sc, Sr, Ss and Sf for supplying the processing liquids to these nozzles Na to Ne.

A chemical supply source Sc supplies a cleaning liquid containing, for example, diluted hydrofluoric acid (DHF) or aqueous ammonia as a chemical. This chemical supply source Sc is connected to the upper nozzle Nc via valves V2, V3 connected in series. Thus, the chemical supplied from the chemical supply source Sc is discharged from the upper nozzle Nc when the controller 9 opens the valves V2 and V3, and the discharge of the chemical from the upper nozzle Nc is stopped when the controller 9 closes either one of the valves V2 and V3.

A rinsing liquid supply source Sr supplies pure water such as DIW (De-Ionized Water), carbonated water, ozone water, hydrogen water or organic solvent such as IPA (Isopropyl Alcohol) as a rinsing liquid. This rinsing liquid supply source Sr is connected to the upper nozzle Nc via valves V4 and V3 connected in series. Thus, the rinsing liquid supplied from the rinsing liquid supply source Sr is discharged from the upper nozzle Nc when the controller 9 opens the valves V4 and V3, and the discharge of the rinsing liquid from the upper nozzle Nc is stopped when the controller 9 closes either one of the valves V4 and V3. Further, the rinsing liquid supply source Sr is connected to the lower nozzle Nb (FIG. 5) via a valve V5. Thus, the rinsing liquid supplied from the rinsing liquid supply source Sr is discharged from the lower nozzle Nb when the controller 9 opens the valve V5, and the discharge of the rinsing liquid from the lower nozzle Nb is stopped when the controller 9 closes the valve V5.

The solvent supply source Ss supplies an organic solvent used in a replacement process for replacing the rinsing liquid on the substrate W. In this embodiment, IPA is used as the organic solvent. This solvent supply source Ss is connected to the lower nozzle Na via a valve V6. Thus, the solvent supplied from the solvent supply source Sc is discharged from the lower nozzle Na when the controller 9 opens the valve V6, and the discharge of the solvent from the lower nozzle Na is stopped when the controller 9 closes the valve V6. Further, the solvent supply source Ss is connected to the upper nozzle Nd via a valve V7. Thus, the solvent supplied from the solvent supply source Ss is discharged from the upper nozzle Nd when the controller 9 opens the valve V7, and the discharge of the solvent from the upper nozzle Nd is stopped when the controller 9 closes the valve V7.

A filler solution supply source Sf supplies a solution obtained by dissolving a filler, which is polymer such as acrylic resin, into water, as the filler solution. This filler solution supply source Sf is connected to the upper nozzle Ne via a valve V8. Thus, the filler solution supplied from the filler solution supply source Sf is discharged from the upper nozzle Ne when the controller 9 opens the valve V8, and the discharge of the filler solution from the upper nozzle Ne is stopped when the controller 9 closes the valve V8.

Figure 6:
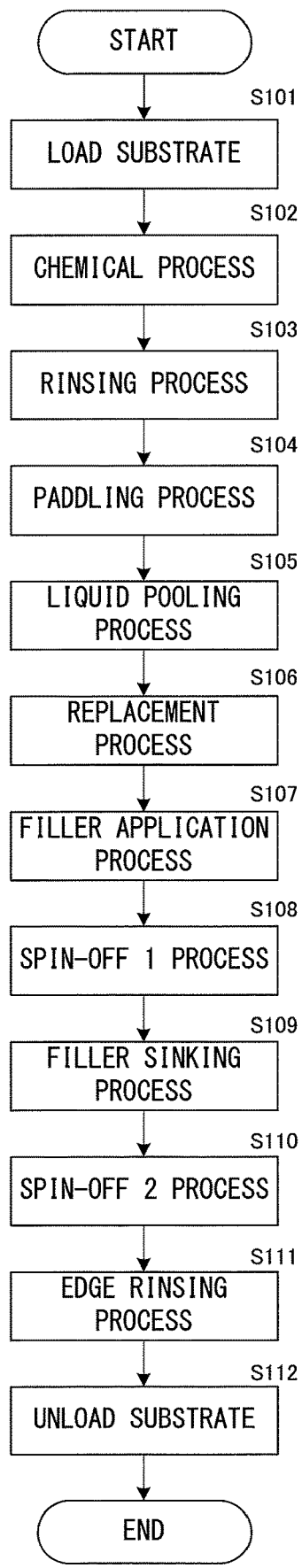
FIG. 6 is a flow chart showing an example of a substrate processing method performed by the substrate processing system of FIG. 1 using the cleaning process unit of FIGS. 2 and 3.
Figure 7:
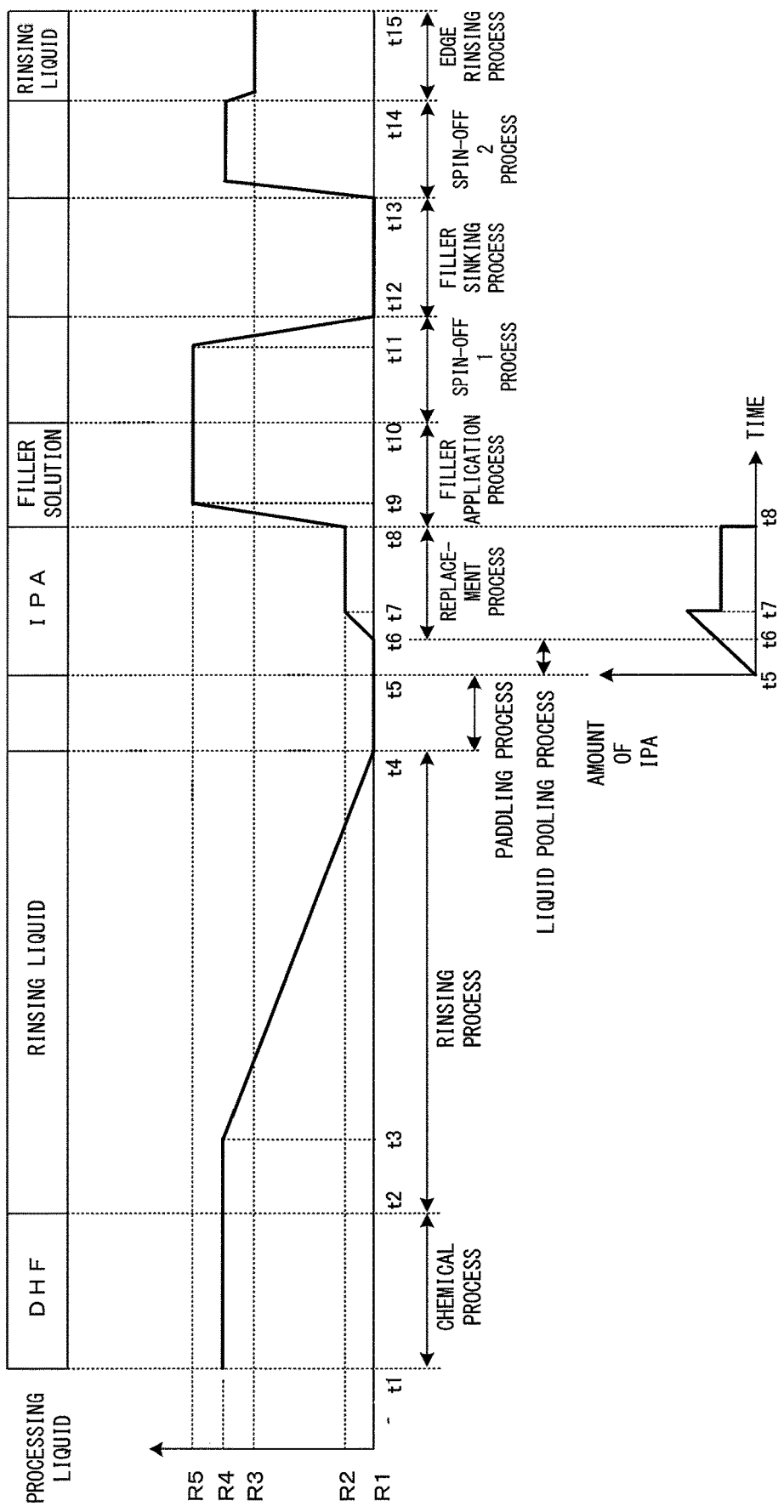
FIG. 7 is a timing chart showing an example of an operation performed in accordance with the substrate processing method of FIG. 6.
Figure 8:
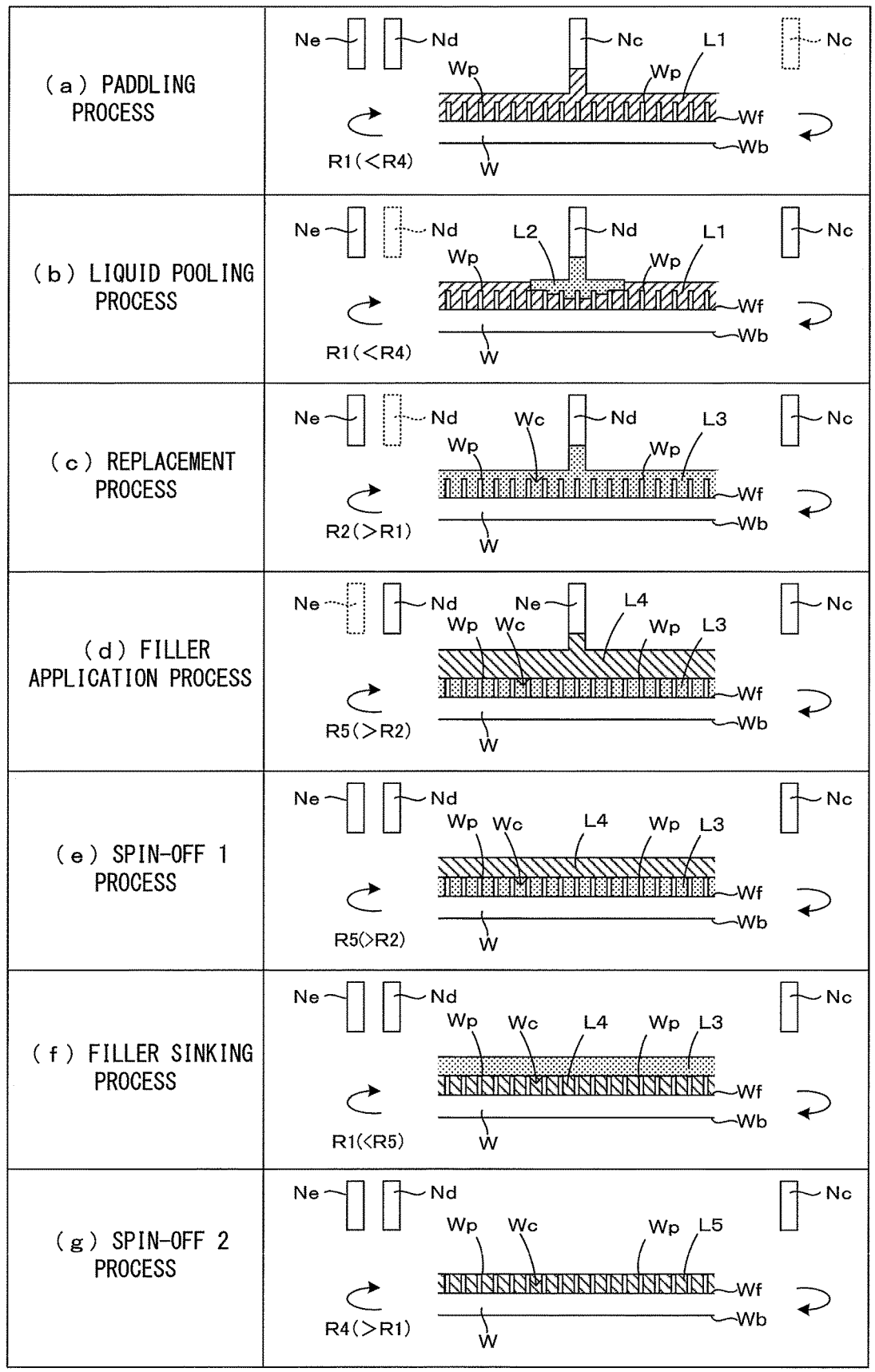
FIG. 8 is side views schematically showing a state of the substrate process performed on the substrate by the substrate processing method of FIG. 6.

FIG. 6 is a flow chart showing an example of a substrate processing method performed by the substrate processing system of FIG. 1 using the cleaning process unit of FIGS. 2 and 3. Further, FIG. 7 is a timing chart showing an example of an operation performed in accordance with the substrate processing method of FIG. 6. Further, FIG. 8 is side views schematically showing a state of the substrate process performed on the substrate by the substrate processing method of FIG. 6. This flow chart is performed by the control of the controller 9. Note that nitrogen gas is continuously supplied to between the substrate W and the cover plate 35 from the gas supply port 334 throughout an execution period of this flow chart of FIG. 6.

When an unprocessed substrate W is loaded onto the upper surface of the spin chuck 31 of the cleaning process unit 3 by the center robot CR (Step S101), the spin chuck 31 sucks and holds this substrate W. Further, the cover plate 35 located at the separated position Pd is elevated to the proximate position Pc. Subsequent to that, the spin chuck 31 starts rotating and a rotational speed of the substrate W is accelerated from zero to a rotational speed R4. Subsequently, a chemical process of Step S102 is started with the cover plate 35 located at the proximate position Pc.

In this chemical process, the upper nozzle Nc is positioned to face the central portion of the front surface of the substrate W and the supply of DHF (chemical) from the upper nozzle Nc to the substrate W is started with the substrate W rotating at the constant rotational speed R4 (e.g. 800 rpm) (time t1). Then, during a period from time t1 to time t2, the DHF continuously supplied to the central portion of the front surface Wf of the substrate W spreads to the peripheral edge of the front surface Wf of the substrate W upon receiving a centrifugal force generated by the rotation of the substrate W, whereby the chemical process by the DHF is performed on the front surface Wf of the substrate W.

When the chemical process is completed at time t2, the upper nozzle Nc stops the supply of the DHF and a rinsing process (Step S103) is started. In this rinsing process, the rotational speed of the substrate W is decelerated from the rotational speed R4 to a rotational speed R1 over a period from time t3 to time t4 after being maintained constant at the rotational speed R4 through a period from time t2 to time t3. Here, the rotational speed R1 is a rotational speed lower than a rotational speed capable of maintaining a puddle-shaped liquid film of the rinsing liquid formed as described next and equal to or higher than zero. Particularly, the rotational speed R1 is set at zero in this embodiment. Further, the upper nozzle Nc continuously supplies the rinsing liquid to the front surface Wf of the substrate W throughout a period from time t2 to time t4 while facing the central portion of the front surface Wf of the substrate W.

Since the substrate W rotates at the relatively fast rotational speed R4 during the period from time t2 to time t3, the rinsing liquid supplied to the central portion of the front surface Wf of the substrate W quickly spreads to the peripheral edge of the front surface Wf of the substrate W upon receiving a centrifugal force and flies in all directions from this peripheral edge. Further, the DHF supplied to the front surface Wf of the substrate W in the previous chemical process is replaced with the rinsing liquid. On the other hand, as the rotational speed of the substrate W is decelerated over the period from time t3 to time t4, a thickness of the liquid film of the rinsing liquid formed on the front surface Wf of the substrate W increases.

By performing such a cleaning process (=chemical process+rinsing process), the front surface Wf of the substrate W is coated with the liquid film of the rinsing liquid after being cleaned with the DHF. On the other hand, the back surface Wb of the substrate W is covered by the cover plate 35 located at the proximate position Pc throughout the execution of the cleaning process, thereby suppressing the adhesion of the DHF and the rinsing liquid to the back surface Wb of the substrate W. Particularly, since the nitrogen gas is continuously supplied to between the back surface Wb of the substrate W and the upper surface of the cover plate 35 in tandem with the cleaning process, a flow of the nitrogen gas from a center of rotation of the substrate W toward the peripheral edge of the substrate W is generated on the lower surface side of the substrate W. In this way, the wrap-around of the DHF and the rinsing liquid from the front surface Wf to the back surface Wb of the substrate W can be more reliably suppressed by the flow of the nitrogen gas.

When the rinsing process is completed at time t4, a puddling process (Step S104) is started. That is, when the rotational speed of the substrate W becomes the rotational speed R1, i.e. zero at time t4, the controller 9 controls a rotational position, at which the spin chuck 31 is to be stopped, based on an output of an encoder of a motor constituting the rotation driver 34. This causes the spin chuck 31 to be stopped at the rotational position at which the engaging projection 333 of the spin chuck 31 faces the engaging hole 352 of the cover plate 35 in the vertical direction Z. When the rotation of the substrate W is stopped in this way, the cover plate 35 is lowered from the proximate position Pc to the separated position Pd to engage the spin chuck 31.

Until time t5, the rinsing liquid is continuously supplied to the front surface Wf of the substrate W to perform the puddling process also after the rinsing process by the upper nozzle Nc is completed. A supply speed of the rinsing liquid in this puddling process is the same as that of the rinsing process. When time t5 is reached, the upper nozzle Nc stops supplying the rinsing liquid. That is, in the puddling process, the rinsing liquid is continuously supplied to the front surface Wf of the substrate W whose rotational speed is decelerated from the rotational speed R4 throughout a period from time t4 to time t5. In this way, the front surface Wf of the substrate W is coated with a puddling-shaped liquid film L1 formed by a large amount of the rinsing liquid as shown in field (a) of FIG. 8, thereby being able to suppress the collapse of the pattern elements Wp upon being subjected to surface tension generated according to the evaporation of the rinsing liquid. Particularly, since the puddling process is performed with the rotation of the substrate W stopped in this embodiment, the entire front surface Wf of the substrate W is held in a sufficiently wet state and the collapse of the pattern elements Wp can be more reliably suppressed.

When the puddling process is completed at time t5, the upper nozzle Nc is retracted from a position above the central portion of the front surface of the substrate W after the supply of the rinsing liquid from the upper nozzle Nc is stopped. Further, simultaneously with this, a liquid pooling process (Step S105) is performed. That is, the upper nozzle Nd is moved to and located at the position above the central portion of the front surface of the substrate W at time t5 instead of the upper nozzle Nc with the rotational speed of the substrate W maintained at the rotational speed R1. Further, as shown in field (b) of FIG. 8, IPA is supplied as an example of an "organic solvent" of the invention from the positioned upper nozzle Nd to the central portion of the front surface Wf of the substrate W. This causes a liquid pool L2 of the IPA to be formed in a central portion of the liquid film L1 of the rinsing liquid. In this embodiment, this liquid pooling process is continued until time t6 and the liquid pool L2 grows to a predetermined size.

When the liquid pooling process is completed at time t6, the spin chuck 31 starts rotating and a replacement process of Step S106 and a filler application process of Step S107 are performed in this order. Further, since the cover plate 35 is engaged with the spin chuck 31 while these replacement process and filler application process are performed, the cover plate 35 also rotates according to the rotation of the substrate W.

In the replacement process (Step S106), the rotational speed of the substrate W is maintained at a rotational speed R2 until time t8 after being accelerated from zero (rotational speed R1) to the rotational speed R2 during a period from time t6 to time t7 with the supply of the IPA from the upper nozzle Nd continued. The rotational speed R2 is a rotational speed higher than the rotational speed R1 and capable of causing the liquid (rinsing liquid, IPA) present on the front surface Wf of the substrate W to fly in all directions from the peripheral edge of the front surface Wf of the substrate W. Particularly, in this embodiment, the rotational speed R2 is set to be lower than the rotational speed R4, e.g. set at 300 rpm. The IPA continuously supplied to the central portion of the front surface Wf of the substrate W in this way is subjected to a centrifugal force to remove the rinsing liquid from the front surface Wf of the substrate W while spreading to the peripheral edge of the front surface Wf of the substrate W. Note that a supply amount of the IPA per unit time during the execution of the liquid pooling process (Step S105) and the replacement process (Step S106) is constant in this embodiment.

Here, if a liquid quantity of the IPA present on the front surface Wf of the substrate W is focused, the IPA is supplied to the front surface Wf at a constant supply speed with the rotational speed of the substrate set at zero (rotational speed R1) during the period of the liquid pooling process from time t5 to time t6. Since no centrifugal force is generated at this time, the supplied IPA is accumulated on the front surface Wf at a relatively fast speed and a liquid pool of the IPA grows to the peripheral edge portion as shown in FIG. 7. The substrate is rotated at the rotational speed R2 from time t7 (time at which a concentration of the IPA becomes substantially uniform in the entire front surface Wf of the substrate).

Since a flying amount of the mixture liquid from the front surface Wf temporarily increases at time t7, the amount of the IPA on the front surface Wf decreases. Thereafter, the supply speed of the IPA and a decrease rate of the mixture liquid flying from the front surface Wf are balanced during a period from time t7 to time t8 and a state where a constant amount of the IPA is accumulated on the front surface Wf is maintained.

By supplying the IPA in such a supply amount profile, the rinsing liquid coating the front surface Wf of the substrate W can be replaced with a liquid film L3 of the IPA as shown in field (c) of FIG. 8 while so-called liquid separation is prevented. Specifically, since the liquid pool L2 is already formed when the substrate W starts rotating, i.e. at time t6, so-called liquid separation in which a gas phase enters an interface between the rinsing liquid and the IPA (organic solvent) does not occur during the replacement process. Thus, the entrance of bubbles between the plurality of pattern elements Wp formed on the front surface Wf of the substrate W, i.e. in the concave portions Wc can be reliably prevented, with the result that the concave portions Wc are filled with the IPA without entraining bubbles.

When the replacement process is completed at time t8, the upper nozzle Nd is retracted from the position above the central portion of the substrate W after the supply of the IPA from the upper nozzle Nd is stopped. Further, simultaneously with this, the filler application process (Step S107) is performed. In this filler application process, the upper nozzle Ne is moved to and located at the position above the central portion of the front surface of the substrate W instead of the upper nozzle Nd and the rotational speed of the substrate W is maintained at a rotational speed R5 until time t10 after being quickly accelerated from the rotational speed R2 to the rotational speed R5 during a period from time t8 to time t9. Here, the rotational speed R5 is a rotational speed higher than the rotational speed R2. Particularly, in this embodiment, the rotational speed R5 is set to be equal to or higher than the rotational speed R4 (e.g. 1500 rpm to 2000 rpm). Further, the upper nozzle Ne facing the central portion of the front surface of the substrate W supplies the filler solution to the front surface Wf of the substrate W throughout a period from time t8 to time t10. Note that the filler solution is supplied by the upper nozzle Ne discharging the filler solution shot by shot. In this way, the filler solution supplied to the center of the front surface Wf of the substrate W spreads on the liquid film L3 of the IPA upon being subjected to a centrifugal force. As a result, as shown in field (d) of FIG. 8, a liquid film L4 of the filler solution is laminated on the liquid film L3 of the IPA on the front surface Wf of the substrate W.

Incidentally, in this embodiment, the cover plate 35 is rotated at a high speed in tandem with the execution of the replacement process and the filler application process. This high-speed rotation of the cover plate 35 is performed to remove the rinsing liquid fallen down onto the cover plate 35 from the substrate W during the puddling process from the cover plate 35 by a centrifugal force.

When the filler application process is completed at time t10, the upper nozzle Ne stops supplying the filler solution and is retracted from the position above the central portion of the substrate W. Further, simultaneously with this, a spin-off 1 process (Step S108) is performed. In this spin-off 1 process, the rotational speed of the substrate W is decelerated to the rotational speed R1 (zero in this embodiment) from time t11 to time t12 after being maintained at the rotational speed R5 throughout a period from time t10 to time W. In this way, excess filler solution is removed from the front surface Wf of the substrate W and a thickness of the liquid film L4 of the filler solution is adjusted to a desired thickness as shown in field (e) of FIG. 8. At this time, the controller 9 controls a rotational position, at which the spin chuck 31 stops, based on an output of the encoder of the motor constituting the rotation driver 34. In this way, the spin chuck 31 stops at the rotational position at which the peripheral edge hole 353 of the cover plate 35 faces the nozzle unit 36 in the vertical direction Z. When the rotation of the substrate W and the cover plate 35 is stopped in this way, the cover plate 35 is elevated from the separated position Pd to the proximate position Pc as the elevation of the nozzle unit 36 is started.

When the spin-off 1 process is completed at time t12, a filler sinking process (Step S109) is started. That is, the elapse of a predetermined time is waited after the rotational speed of the substrate W and the cover plate 35 becomes the rotational speed R1, i.e. zero in this embodiment. During this predetermined waiting time, the filler solution laminated on the liquid film L3 of the IPA sinks, whereas the IPA emerges. As a result, as shown in field (f) of FIG. 8, the pattern elements Wp formed on the front surface Wf of the substrate W are coated with the liquid film L4 of the filler solution and the filler solution is filled between adjacent ones of the pattern elements Wp, i.e. in the concave portions Wc.

When the filler sinking process is completed at time t13, the rotation of the substrate W is started and the rotational speed of the substrate W is accelerated from zero to the rotational speed R4. Then, by rotating the substrate W at the constant rotational speed R4 for a predetermined time until time t14, a spin-off 2 process of removing the IPA and excess filler solution from the front surface Wf of the substrate W is performed (Step S110). As a result, as shown in field (g) of FIG. 8, the clearances between adjacent ones of the pattern elements Wp, i.e. the concave portions Wc are filled by a liquid film L5 of the filler solution having a thickness about equal to a height of the pattern elements Wp.

When the spin-off 2 process is completed at time t14, an edge rinsing process (Step S111) is performed. In this edge rinsing process, the rotational speed of the substrate W is maintained at the rotational speed R3 after being decelerated from the rotational speed R4 to the rotational speed R3. Then, the lower nozzles Na and Nb discharge the processing liquids to the back surface Wb of the substrate rotating at the constant rotational speed R3. Specifically, the lower nozzle Na discharges the IPA (organic solvent) toward the peripheral edge of the back surface Wb of the substrate W. In this way, the filler solution adhering to the peripheral edge of the back surface Wb of the substrate W when the filler solution is applied is removed. Further, the lower nozzle Nb discharges the rinsing liquid to the vicinity of the peripheral edge of the back surface Wb of the substrate W. The rinsing liquid discharged in this way washes away particles and the like from the back surface Wb of the substrate W while running toward the peripheral edge along the back surface Wb of the substrate W due to a centrifugal force.

When the edge rinsing process is completed at time t15, the rotation of the substrate W is stopped and the cover plate 35 is lowered. Note that a control similar to the control of the stop position of the spin chuck 31 described above is executed here and the lowered cover plate 35 engages the spin chuck 31. Then, the substrate W is released from suction by the spin chuck 31 and the center robot CR unloads the substrate W from the cleaning process unit 3 (Step S112).

As described above, in this embodiment, the liquid pool L2 of the IPA is formed in the central portion of the liquid film L1 of the rinsing liquid immediately before the replacement process by the IPA is performed. Thus, the liquid pool L2 is present when the rotational speed of the substrate W is increased to start the replacement process, whereby liquid separation can be reliably prevented. Specifically, the concave portions Wc can be filled with the IPA without entraining bubbles between adjacent ones of the pattern elements Wp, i.e. in the concave portions Wc. As a result, the filler can be satisfactorily filled into the concave portions Wc of the pattern by a series of processes (Steps S107 to S110) performed in the cleaning process unit 3 thereafter. Further, the occurrence of inconveniences that bubbles burst to leave bubble marks and part of the polymer becomes particles during the execution of the drying process by the heating process unit 4 and the polymer removing process by the filler removing apparatus (not shown) can be prevented.

As just described, in this embodiment, the front surface Wf of the substrate W corresponds to a "pattern forming surface" of the invention. Further, the rinsing process (Step S103), the puddling process (Step S104), the liquid pooling process (Step S105), the replacement process (Step S106), the filler application process (Step S107) and the filler sinking process (Step S109) respectively correspond to examples of a "rinsing step", a "liquid film forming step", a "liquid pool forming step", a "replacement step", an "application step" and a "filling step" of the invention. Further, the rotational speeds R4, R1 respectively correspond to examples of a "first rotational speed" and a "second rotational speed" of the invention. Further, the spin chuck 31, the rotation driver 34 and the controller 9 respectively correspond to examples of a "holder", a "rotator" and a "control unit" of the invention. Further, the rinsing liquid supply source Sr and the upper nozzle Nc function as a "rinsing liquid supply unit" of the invention, the solvent supply source Ss and the upper nozzle Nd function as an "organic solvent supply unit" of the invention, and the filler solution supply source Sf and the upper nozzle Ne functions as a "filler solution supply unit" of the invention.

Figure 9:
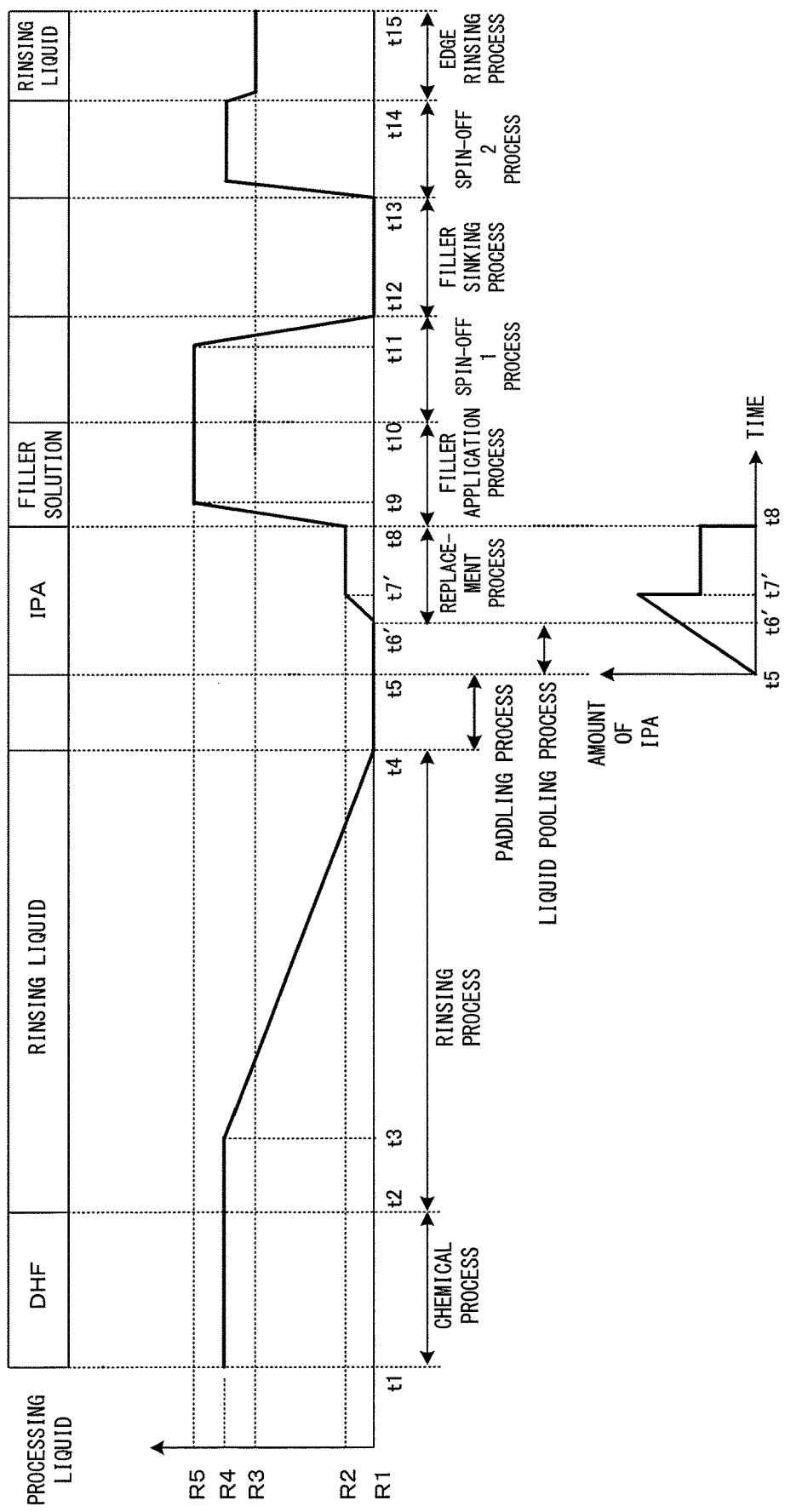
FIG. 9 is a timing chart showing the other example of the operation performed in accordance with the substrate processing method of FIG. 6.

Note that the invention is not limited to the above embodiment and various changes other than those described above can be made without departing from the gist of the invention. For example, the size of the liquid pool L2 formed on the liquid film L1 of the rinsing liquid can be adjusted by changing time t6, the supply amount of the IPA and the like in the liquid pooling process (Step S105). Particularly, in terms of more reliably preventing the occurrence of liquid separation, it is desirable to delay a time, at which the rotational speed of the substrate W is increased, from time t6 to time t6' and increase the supply amount of the IPA, for example, as shown in FIG. 9 (second embodiment).

Further, although a so-called finishing process of removing the IPA and the excess filler solution from the front surface Wf of the substrate W is performed by the spin-off 2 process in the above embodiment, a vaporization assisting process (gas supplying step) and an atmosphere removing process (cleaning liquid supplying step) may be performed together with the spin-off 2 process in this finishing process (third embodiment). The third embodiment of the invention is described below with reference to FIGS. 10 to 12.

Figure 10:
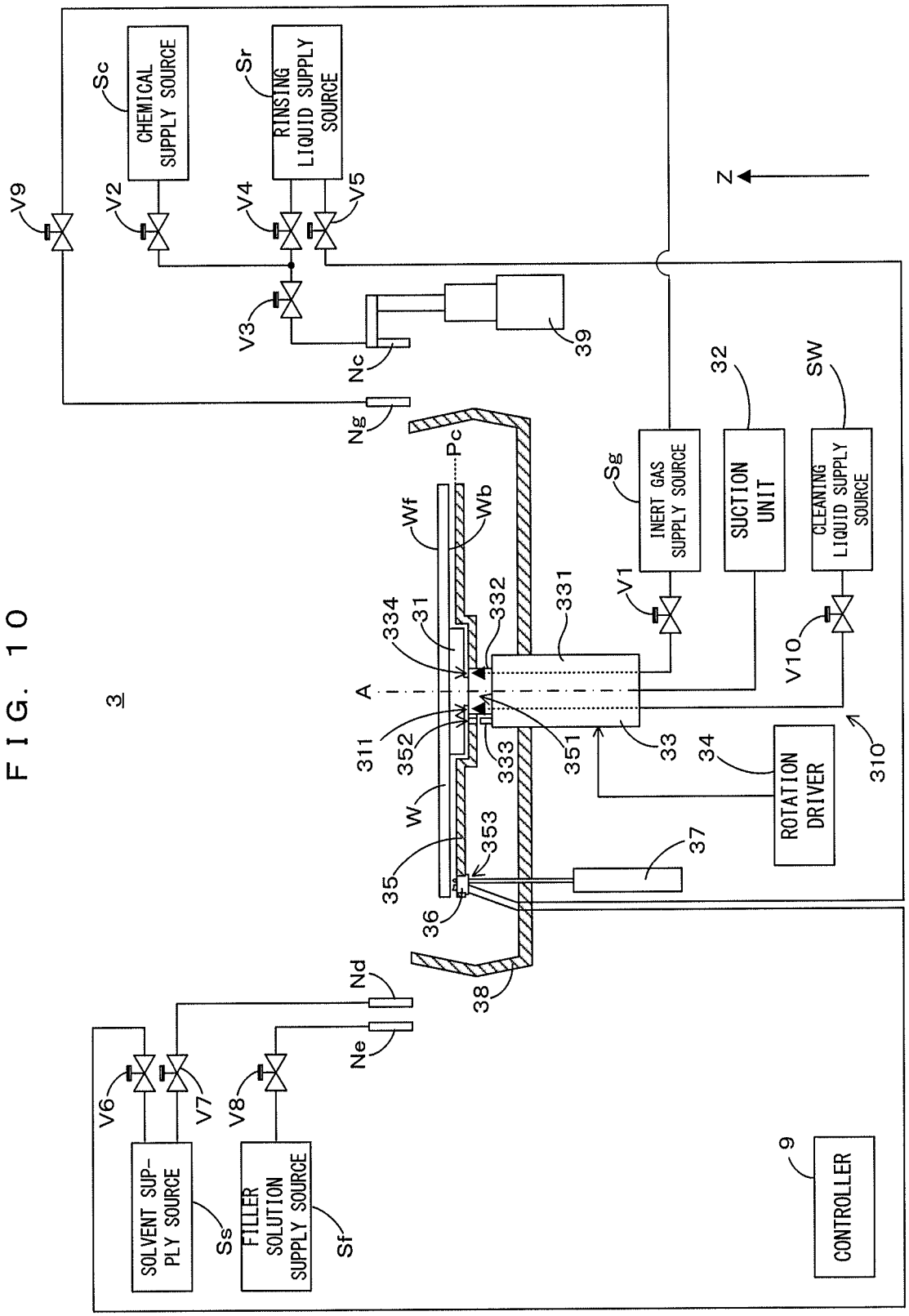
FIG. 10 is a diagram showing the configuration of a cleaning process unit as a third embodiment of the substrate processing apparatus according to the invention.

FIG. 10 is a diagram showing the configuration of a cleaning process unit as a third embodiment of the substrate processing apparatus according to the invention. This cleaning process unit 3 largely differs from the cleaning process unit 3 (FIGS. 2, 3) according to the first embodiment in including an upper nozzle Ng for supplying inert gas toward a front surface Wf of a substrate W and a cleaning liquid supply unit 310 for supplying a cleaning liquid toward a central portion of a back surface Wb (principal surface of the substrate W on a side opposite to a pattern forming surface) of the substrate W. The other configuration is basically the same as the cleaning process unit 3 according to the first embodiment. Accordingly, the same components are denoted by the same reference signs and not described and points of difference are described in detail below.

In the third embodiment, the upper nozzle Ng is further provided besides upper nozzles Nc, Nd and Ne and a nozzle driver 39 (see FIG. 2) is provided for the upper nozzle Ng. The nozzle driver 39 operates in response to a command from a controller 9, whereby the upper nozzle Ng moves between a gas supply position and a standby position. The gas supply position means a position separated upwardly from the central portion of the front surface Wf of the substrate W and the standby position means a position separated from a cup 38.

As shown in FIG. 10, an inert gas supply source Sg is connected to the upper nozzle Ng via a valve V9. Thus, when the controller 9 opens the valve V9, inert gas is supplied from the inert gas supply source Sg toward the central portion of the front surface Wf of the substrate W held by a spin chuck 31. In this way, the inert gas flows from a center toward a peripheral edge of the substrate W along the front surface Wf of the substrate W (see broken-line arrows in field (b) of FIG. 12 to be described later). On the other hand, when the controller 9 closes the valve V9, the supply of the gas from the inert gas supply source Sg is stopped.

Further, in the cleaning liquid supply unit 310, a cleaning liquid supply port 311 open in an upper part of a cylindrical section 332 of a rotary shaft 33 is connected to a cleaning liquid supply source Sw via a valve V10 as shown in FIG. 10. Thus, when the controller 9 opens the valve V10, the cleaning liquid (e.g. pure water such as DIW, carbonated water, ozone water or hydrogen water) is supplied from the cleaning liquid supply port 311 toward the central portion of the back surface Wb of the substrate W held by the spin chuck 31. The cleaning liquid supplied in this way is collected into the cup 38 after flowing in a direction from the center toward the peripheral edge of the substrate W along the back surface Wb of the substrate W. On the other hand, when the controller 9 closes the valve V10, the supply of the gas from the cleaning liquid supply source Sw is stopped.

Figure 11:
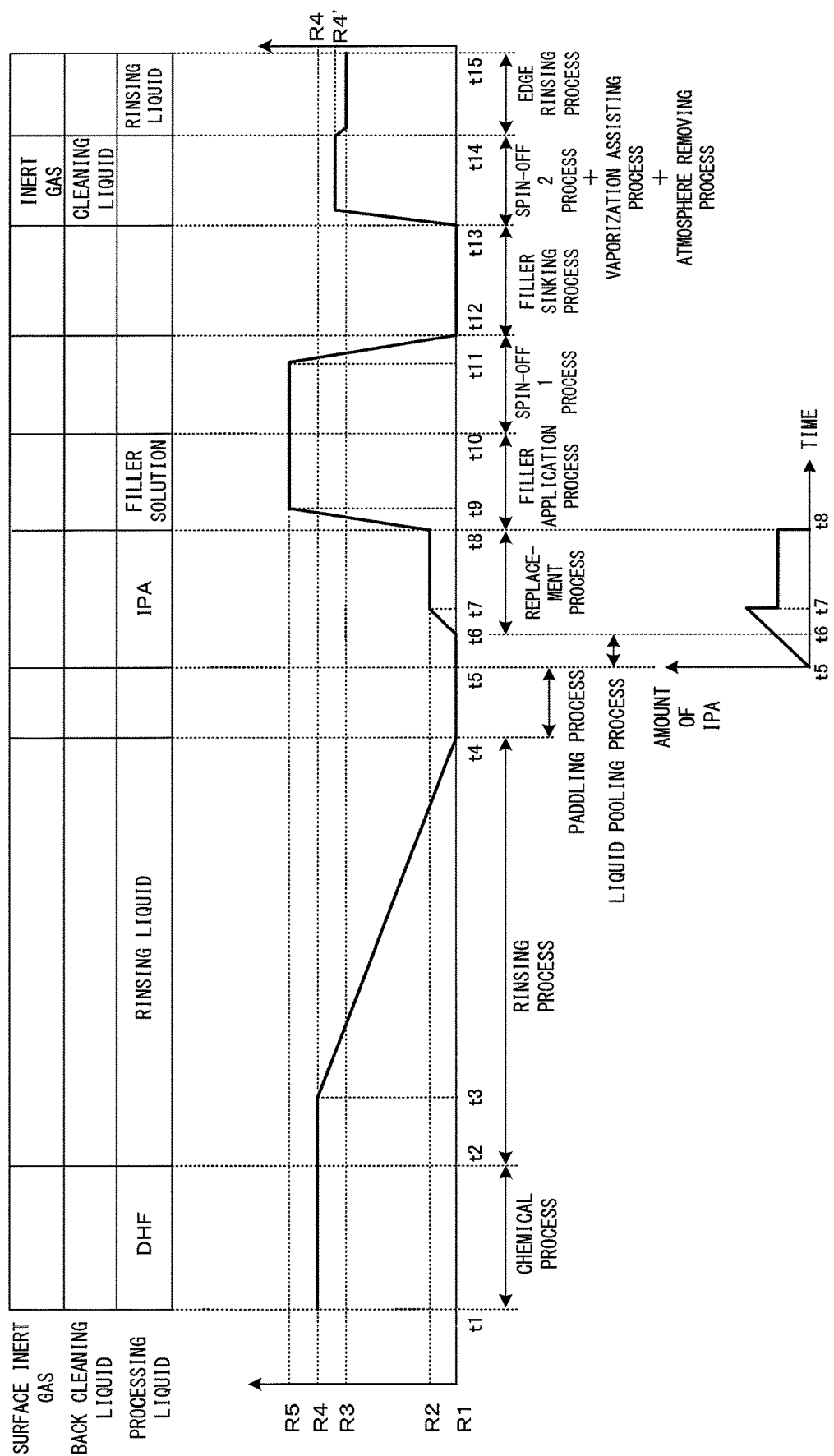
FIG. 11 is a timing chart showing an example of a substrate processing operation performed by the cleaning process unit shown in FIG. 10.
Figure 12:
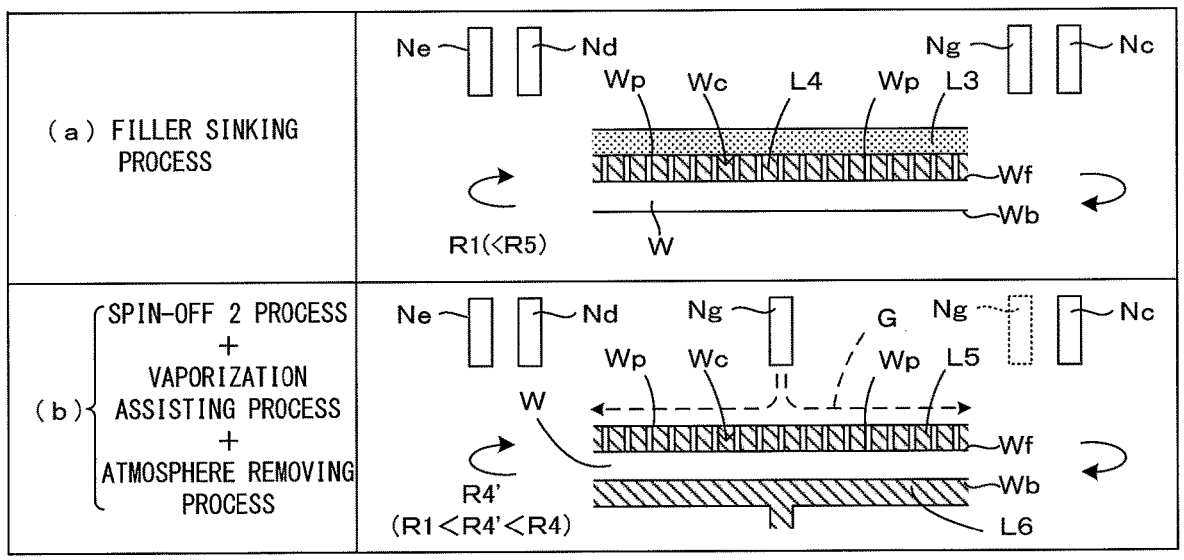
FIG. 12 is side views schematically showing states of the spin-off 2 process, the vaporization assisting process and the atmosphere removing process performed by the cleaning process unit shown in FIG. 10.

Also in the cleaning process unit 3 thus configured, the substrate processing method shown in FIG. 6 is performed as in the first embodiment. However, in the third embodiment, the vaporization assisting process and the atmosphere removing process are performed in tandem with the spin-off 2 process as shown in FIGS. 11 and 12. Note that other processes are as in the first embodiment.

FIG. 11 is a timing chart showing an example of a substrate processing operation performed by the cleaning process unit shown in FIG. 10. Further, FIG. 12 is side views schematically showing states of the spin-off 2 process, the vaporization assisting process and the atmosphere removing process performed by the cleaning process unit shown in FIG. 10. In this third embodiment, as in the first embodiment, a series of processings of S101 to S109 are performed, pattern elements Wp formed on the front surface Wf of the substrate W are covered with a liquid film L4 of a filler solution and the filler solution is filled between adjacent ones of the pattern elements Wp, i.e. in concave portions Wc as shown in field (a) of FIG. 12.

Here, only the spin-off 2 process may be performed as in the first embodiment. However, depending on properties (viscosity, volatility, surface tension, solubility of solvent and filler, etc.) of the filler solution, a filling rate of the filler solution in the concave portions Wc may become nonuniform within the plane of the substrate W. Specifically, a centrifugal force generated by high-speed rotation of the substrate W increases from a central portion toward a peripheral edge portion of the substrate W. Particularly, in the peripheral edge portion, the filler solution having entered the concave portions Wc may be discharged from the concave portions Wc by the above centrifugal force. Thus, the filling rate may be reduced at the peripheral edge portion. If a baking process is, for example, performed with the filling rate remaining to be nonuniform in this way, stresses acting on the concave portions Wc are biased in the peripheral edge portion due to the shrinkage of the filler solution. Further, if an ashing process is performed, stresses act on central sides and peripheral edge sides of the concave portions Wc. Here, since the filling rate is uniform in the concave portions Wc in the central portion of the substrate W, stresses on the central side and those on the peripheral side are substantially equal. In contrast, since the filling rate is low in the concave portions Wc in the peripheral edge portion of the substrate W, stresses on the central side are larger than those on the peripheral edge side and the pattern elements Wp may be inclined in an outer circumferential direction. As just described, it is important to make the filing rate even more uniform within the plane of the front surface Wf of the substrate W in order to even more satisfactorily prevent the collapse of the pattern.

Accordingly, in the third embodiment, the vaporization assisting process and the atmosphere removing process are additionally performed in addition to the spin-off 2 process as described above. In the third embodiment, as shown in FIG. 11, a rotational speed R4' in the spin-off 2 process is reduced to be lower than the rotational speed R4 in the first embodiment. That is, the rotational speed R4' is set to satisfy the following inequality.

$$R1 < R4' < R4$$

Thus, it is possible to effectively prevent the filling rate in the peripheral edge portion from becoming drastically lower than that in the central portion.

Further, in tandem with the spin-off 2 process, the controller 9 gives a movement command to the nozzle driver 39 to locate the upper nozzle Ng to the gas supply position and further opens the valve V9 to supply the inert gas toward the central portion of the front surface Wf of the substrate W. In this way, as shown in field (b) of FIG. 12, inert gas G flows in a direction from the center toward the peripheral edge of the substrate W along the front surface Wf of the substrate W. Thus, the solvent contained in the filler solution is mixed into the inert gas and is discharged to the outer peripheral side of the substrate W. As a result, a drying condition within the plane of the substrate W can be made uniform.

Here, the inert gas containing the solvent is present in the atmosphere in the cup 38. If the solvent incorporated into the inert gas adheres to the substrate W, this becomes particles. Although the inert gas containing the solvent is present in the atmosphere in the cup 38, the atmosphere removing process described next is unnecessary if this inert gas can be efficiently collected outside the cup 38. However, to reliably prevent the formation of particles, the atmosphere removing process is performed in tandem in the third embodiment. Specifically, the controller 9 opens the valve V10 to supply a cleaning liquid L6 toward the central portion of the back surface Wb of the substrate W. This causes the cleaning liquid L6 to flow in the direction from the center toward the peripheral edge of the substrate W along the back surface Wb of the substrate W, thereby preventing the solvent incorporated into the inert gas from adhering to the back surface Wb of the substrate W. Further, the above cleaning liquid L6 flies in all directions to the outer periphery of the substrate W to incorporate the solvent and is discharged to the outside of the cup 38. As just described, the solvent can be reliably removed from the atmosphere of the cup 38 and the adhesion of the solvent to the substrate W can be reliably prevented.

As described above, according to the third embodiment, it is possible not only to reliably prevent the entrainment of bubbles into the concave portions Wc as in the first embodiment, but also to make the filling rate of the filler solution more uniform within the plane of the substrate W. As a result, the filler can be more satisfactorily filled in the concave portions.

Although the vaporization assisting process and the atmosphere removing process are performed concurrently with the spin-off 2 process, only the vaporization assisting process may be concurrently performed if the inert gas containing the solvent can be reliably removed from the atmosphere in the cup 38. Further, in the third embodiment, the vaporization assisting process and the atmosphere removing process are added and applied in the substrate processing method for performing a series of processings (Steps S1010 to S109) before the spin-off 2 process is performed. However, the additional application of the vaporization assisting process and the atmosphere removing process is not limited to this. That is, only the vaporization assisting process or the vaporization assisting process and the atmosphere removing process may be applied to substrate processing methods in general for performing a process of removing an excess of the filler solution from the front surface Wf of the substrate W by rotating the substrate W after the filler sinking process is performed as shown in FIG. 12.

The method of discharging the cleaning liquid to the back surface of the substrate is not limited to the method described above. For example, a back surface scanning nozzle may scan and discharge the cleaning liquid to a different from the center portion out of the back surface while holding the center portion of the back surface of the substrate by a vacuum chuck.

Further, although the rotational speed R1 of the substrate W is set at zero in the above embodiment, the value of the rotational speed R1 is not limited to this and is arbitrary if the rotational speed R1 is below the rotational speed capable of maintaining the puddle-shaped liquid film L1 of the rinsing liquid. Further, it is not an essential requirement to match the rotational speed during the puddling process (Step S104) and that during the liquid pooling process (Step S105). For example, if the rotational speed during the puddling process is set at a value larger than zero, the rotational speed during the liquid pooling process may be set lower than that, e.g. set at zero.

Further, if source facilities capable of supplying processing liquids and gases to be supplied are available, these may be utilized as various supply sources Sc, Sr, Ss, Sf, Sg and Sw.

Further, the process of removing the solidified filler from the substrate W has been performed by the external filler removing apparatus different from the substrate processing system 1. However, the substrate processing system 1 may have a filler removing function. For example, the filler may be removed by sublimation in the heating process unit 4.

This invention can be applied to substrate processing techniques in general for performing a replacement process for the purpose of filling an organic solvent in concave portions of a pattern formed on a pattern forming surface of a substrate before a filler is filled into the concave portions.

Although the disclosure has been described with reference to specific embodiments, this description is not meant to be construed in a limiting sense. Various modifications of the disclosed embodiment, as well as other embodiments of the present disclosure, will become apparent to persons skilled in the art upon reference to the description of the disclosure. It is therefore contemplated that the appended claims will cover any such modifications or embodiments as fall within the true scope of the disclosure.

What is claimed is:

1. A substrate processing method, comprising:
a liquid film forming step of forming a liquid film puddle of a rinsing liquid on a pattern forming surface of a substrate formed with a pattern;
a liquid pool forming step of forming a liquid pool of an organic solvent by supplying the organic solvent to the liquid film puddle near a center of rotation of the substrate while maintaining the puddle;
after the liquid pool forming step, a replacement step of replacing the rinsing liquid constituting the liquid film with the organic solvent by supplying the organic solvent to the liquid pool while rotating the substrate at a rotational speed higher than in the liquid pool forming step;
an application step of applying a filler solution to the pattern forming surface coated with the organic solvent;
a filling step of causing a filler contained in the filler solution and applied to the pattern forming surface to sink and fill concave portions of the pattern with the filler;
a rinsing step of rinsing the pattern forming surface by supplying the rinsing liquid to the pattern forming surface while rotating the substrate at a first rotational speed, wherein:
the liquid film forming step includes a step of decelerating the rotational speed of the substrate to a second rotational speed lower than the first rotational speed, the step being performed following the rinsing step;
the liquid pool forming step includes a step of setting the rotational speed of the substrate equal to or lower than the second rotational speed; and
the rotation of the substrate is stopped and the organic solvent is supplied in the liquid pool forming step.

2. The substrate processing method according to claim 1, further comprising:
a finishing step of discharging the organic solvent and an excess of the filler solution from the pattern forming surface while causing the filler to remain in the concave portions of the pattern by rotating the substrate, the finishing step being performed following the filling step.

3. The substrate processing method according to claim 2, wherein:
the finishing step includes a gas supplying step of supplying inert gas to a central portion of the pattern forming surface in tandem with the rotation of the substrate.

4. The substrate processing method according to claim 3, wherein:
the finishing step includes a cleaning liquid supplying step of supplying a cleaning liquid to a central portion of a principal surface of the substrate on a side opposite to the pattern forming surface in tandem with the rotation of the substrate.

5. The substrate processing method according to claim 1, wherein:
the rotation of the substrate is stopped and the organic solvent is supplied in the liquid pool forming step.

6. The substrate processing method according to claim 1, further comprising:
a chemical step of supplying a chemical to the pattern forming surface while rotating the substrate at the first rotational speed, before the rinsing step.

7. The substrate processing method according to claim 1, wherein:
the filling step includes a first spin-off process in which a rotational speed of the substrate is reduced to a rotational speed that is lower than that in the application step, a filler sinking process in which the rotational speed of the substrate is maintained at said rotational speed in said first spin-off process, and a second spin-off process in which the rotational speed of the substrate is accelerated to a higher rotational speed than in said filler sinking process.

* * * * *